United States Patent [19]

Hosogai et al.

[11] Patent Number: 4,778,393

[45] Date of Patent: Oct. 18, 1988

[54] PIN BOARD MATRIX

[75] Inventors: Masao Hosogai, Kawasaki; Toshihiko Yamamoto, Yokohama; Yasutaka Imori; Nobuteru Hujioka, both of Tokyo, all of Japan

[73] Assignee: Fujitsu Limited, Kawasaki, Japan

[21] Appl. No.: 26,700

[22] PCT Filed: May 31, 1986

[86] PCT No.: PCT/JP86/00279
§ 371 Date: Feb. 2, 1987
§ 102(e) Date: Feb. 2, 1987

[87] PCT Pub. No.: WO86/07208
PCT Pub. Date: Dec. 4, 1986

[30] Foreign Application Priority Data

May 31, 1985 [JP] Japan ................................ 60-118031

[51] Int. Cl.[4] .......................................... H01R 11/03
[52] U.S. Cl. ..................................................... 439/45
[58] Field of Search ..................................... 439/43-48

[56] References Cited

U.S. PATENT DOCUMENTS 3,151,923 10/1964 Bell et al. .............................. 439/48

FOREIGN PATENT DOCUMENTS 1133781 7/1962 Fed. Rep. of Germany ........ 439/45
1081171 8/1967 United Kingdom .................. 439/48

Primary Examiner—Joseph H. McGlynn
Attorney, Agent, or Firm—Staas & Halsey

[57] ABSTRACT

A pin switch board matrix is described including a laminated board with two insulative substrates each, provided with a plurality of parallel conductive X-patterns and Y-patterns, made of resilient metal wires, respectively. The laminated board has a plurality of through holes, each penetrating the two substrates, at positions corresponding to intersections of the respective X and Y-conductive patterns. When a short plug is inserted into a selected through hole, the X and Y-patterns corresponding to the selected via the short plug. The substrates have a plurality of parallel guide grooves for receiving the wire patterns.

2 Claims, 6 Drawing Sheets

PIN BOARD MATRIX

BACKGROUND OF THE INVENTION

This invention relates to an improved matrix switch board for connecting with pin plugs, hereinafter referred to as a pin board matrix. Such a pin board matrix may be advantageously employed in various electrical applications, such as electrical switching or exchange systems.

A conventionally known pin board matrix includes a laminated board with two insulative substrates, one provided thereon with a plurality of parallel conductive patterns extending in the X-direction, and the other provided thereon with a plurality of parallel conductive patterns extending in the Y-direction, substantially perpendicular to the X-direction. The laminated board has a plurality of through holes, each penetrating both of the two substrates at positions corresponding to intersections of the respective X-conductive patterns and Y-conductive patterns, so that when a short plug is inserted into a selected through hole, the X and Y-conductive patterns corresponding to the selected through hole are electrically connected to each other via the short plug.

In such a known pin board matrix the elements of the X and Y-conductive patterns are made of resilient elongated metal strips, each having a substantially U-shaped cross-section as a channel. Both side flap portions of each U-shaped strip are provided with a plurality of corresponding slits spaced in the longitudinal direction. One group of these strips also has a plurality of holes spaced in the longitudinal direction for allowing the short plug to pass therethrough and come into contact with the U-shaped strip in the other group. Thus, when the short plug is inserted into a selected through hole, it comes into resilient contact with one of the X-strip channels, passes through the hole of this strip, and then comes into resilient contact with one of the Y-strip channels.

However, in the known pin board matrix, the construction of the elements of X and Y-conductive patterns is complex and, therefore, expensive. In addition, since the pattern element is U-shaped in cross-section, the thickness of the insulative substrate, i.e., the pin board matrix, must be large to accommodate such elements.

SUMMARY OF THE INVENTION

According to the present invention, there is provided a matrix switch having a laminated board including: at least one insulative substrate, a plurality of parallel conductive patterns extending in the X-direction being formed on a first surface of the at least one substrate; and a plurality of parallel conductive patterns extending in the Y-direction, substantially perpendicular to the X-direction, being formed on a second substrate or on a second surface of the first substrate. The laminated board has a plurality of through holes, each penetrating the at least one substrate at positions corresponding to intersections of the respective X-conductive patterns, and Y-conductive patterns. Moreover when a short plug is inserted into a selected through hole, the X and Y-conductive patterns corresponding to the selected through hole are electrically connected to each other via the short plug. Further, the X and Y-conductive patterns are made of resilient metals wires and the at least one is formed with a plurality of parallel guide grooves for receiving the wires.

As mentioned above, according to the present invention, the X and Y-coordinate patterns can be made of simple and less expensive thin metal wires. Therefore, the distance between the adjacent parallel patterns can be advantageously minimized, so that a compact pin board matrix having a high density can be obtained.

DETAILED DESCRIPTION OF THE PREFERRED EMBODIMENTS

Figure 1:
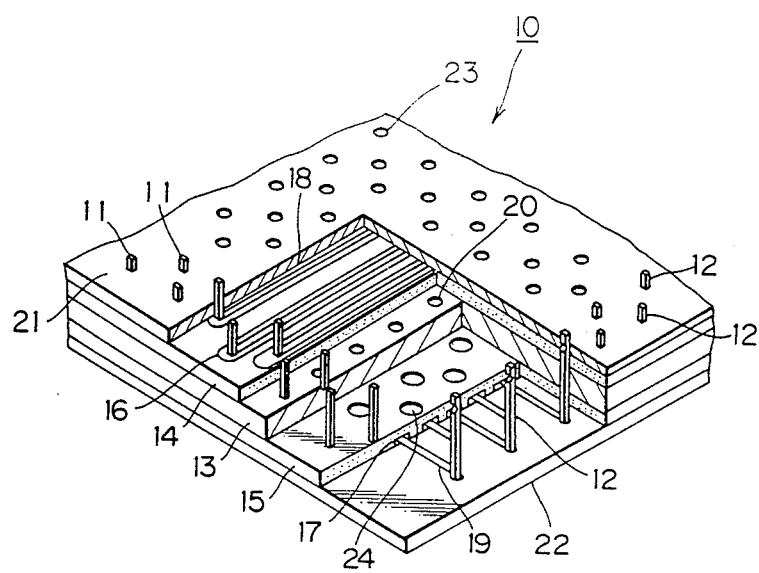
FIG. 1 is a partial cross-sectional, perspective view of a pin board matrix according to the present invention.
Figure 2:
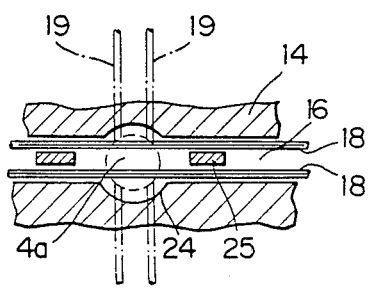
FIG. 2 is a partial plan view illustrating a part of an inner section of the pin board matrix shown in FIG. 1.

Referring now to FIGS. 1 and 2, a pin board matrix 10 according to the present invention includes a rectangular intermediate insulative plate 13, an X-coordinate insulative plate 14, adhered to the top surface of the intermediate plate 13, and a Y-coordinate insulative plate 15, adhered to the bottom surface of the intermediate plate 13. The X and Y-coordinate plates 14 and 15 are covered with surface plates 21 and 22 rigidly adhered to the top and bottom faces thereof, respectively.

A plurality of X-coordinate terminals 11 are arranged along parallel lines at one of the side edges of the pin board matrix 10 as to penetrate the latter and a plurality of Y-coordinate terminals 12 are arranged along parallel lines at another side edge perpendicular to the above side edge to penetrate the pin board matrix 10.

Figure 3:
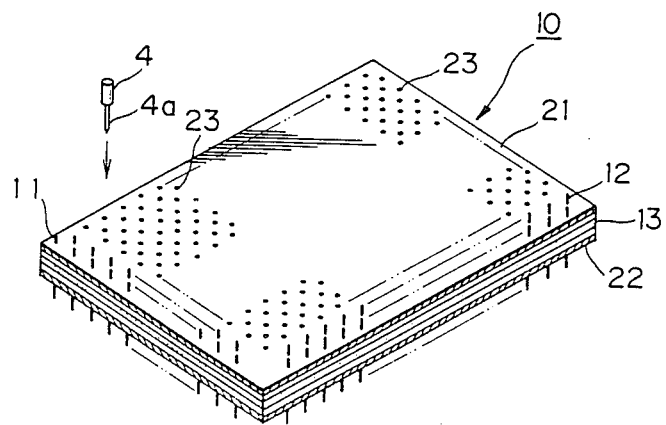
FIG. 3 is a perspective view illustrating the whole pin board matrix shown in FIG. 1.

The surface plates 21 and 22 are provided, at intersections of X and Y-coordinate lines passing through the X and Y-coordinate terminals 11 and 12, respectively, with a plurality of guide slots 23 to which a connecting portion 4a of a short plug 4 is to be inserted. (FIG. 3) At the same intersections, the intermediate plate 13 is also provided with guide slots 20 and the X and Y-coordinate plates 14 and 15 are provided with escape holes 24.

The X-coordinate plate 14 is provided on the top surface thereof with a plurality of X-coordinate grooves 16, arranged in parallel to the X-coordinates, each groove 16 extends from the respective X-coordinate terminal 11 to the portion of the x-coordinate plate 14 in the vicinity of the opposite side edge. In each of the X-coordinate grooves 16 a pair of X-coordinate conductive elements 18 including metal wires are disposed, each of the wires having one end connected to the corresponding X-coordinate terminal 11 by soldering or the like and the other end rigidly secured to the X-coordinate plate 14. The pair of X-coordinate conductive elements 18 are spaced from each other by a distance a little smaller than the diameter of the connecting portion 4a of the short plug 4.

The Y-coordinate plate 15 is provided on the bottom surface thereof with a plurality of Y-coordinate grooves 17 arranged in parallel to the Y-coordinates, each groove 17 extending from the respective Y-coordinate terminal 12 to the portion of the Y-coordinate plate 15 in the vicinity of the opposite side edge. In each of the Y-coordinate grooves 17, a pair of Y-coordinate conductive elements 19 including of metal wires are disposed, where each of the wires has one end connected to the corresponding Y-coordinate terminal 12 by soldering or the like, and the other end rigidly secured to the Y-coordinate plate 15. The pair of Y-coordinate conductive elements 19 are also spaced from each other by a distance a little smaller than the diameter of the connecting portion 4a of the short plug 4.

The X and Y-coordinate conductive elements 18 and 19 may be made of a resilient thin metal wire, for instance, a gold-plated piano wire having a diameter of 0.2 to 0.3 mm. A pair of parallel wires 18 or 19 cooperate to resiliently contact the connecting plug 4a with only a small contact resistance, when the short plug 4 is inserted therebetween. In the respective X and Y-coordinate grooves 16 and 17, spacer projections 25 (FIG. 2) are arranged between the pair of parallel conductive wires 18 or 19 and spaced by appropriate intervals. Therefore, the pair of wires 18 or 19 are prevented from becoming twisted with respect to each other, due to vibration or for other reasons.

The pin board matrix 10 according to the present invention, constructed as mentioned above, is illustrated in FIG. 3 in a perspective view, in which the surface plate 21, the X-coordinate insulative plate 14, the intermediate insulative plate 13, the Y-coordinate insulative plate 15, and the surface plate 22 are integrally laminated as a rectangular matrix board. This board matrix 10 is provided along one side edge with a plurality of X-coordinate terminals 11, arranged on a straight line or in a zigzag on two lines, and along another side edge perpendicular thereto with a plurality of Y-coordinate terminals 12, arranged on a straight line or in a zigzag on two lines. At the respective intersections of the X and Y-coordinate conductive elements 18 and 19, protected and covered by the surface plates 21 and 22, a number of guide slots 23 are thus arranged in a grid. Each guide slot 23 is adapted to receive a short plug 4.

Thus, a prescribed number of short plugs 4 can be inserted into the selected guide slots 23. Consequently, when a short plug 4 is inserted into a guide slot 23, the connecting portion 4a of plug 4 is first inserted between, and resiliently contacts the corresponding pair of X-coordinate conductive elements 18, then penetrates the intermediate plate 13, and is finally inserted between, and resiliently contacts, the corresponding pair of Y-coordinate conductive elements 19. Therefore, the selected X-coordinate conductive elements 18 and the selected Y-coordinate conductive elements 19 are electrically connected to each other via the short plugs 4.

Referring now to FIGS. 4 through 8, another embodiment of a pin board matrix 30 according to the present invention includes a rectangular X-coordinate insulative plate 31 adhered to the top surface of Y-coordinate insulative plate 32 mounted on a bottom surface plate 33. The top surface of X-coordinate insulative plate 31 is covered by a surface plate 34. In this embodiment, each of the X and Y-coordinate conductive patterns includes a single straight wire.

In the same manner as in the previous embodiment, at intersections of the X and Y-coordinate lines, the surface plates 33 and 34 are provided with a plurality of guide slots 35, and the X and Y-coordinate plates 31 and 32 are also provided with escape holes 36 and 37, respectively.

Figure 5:
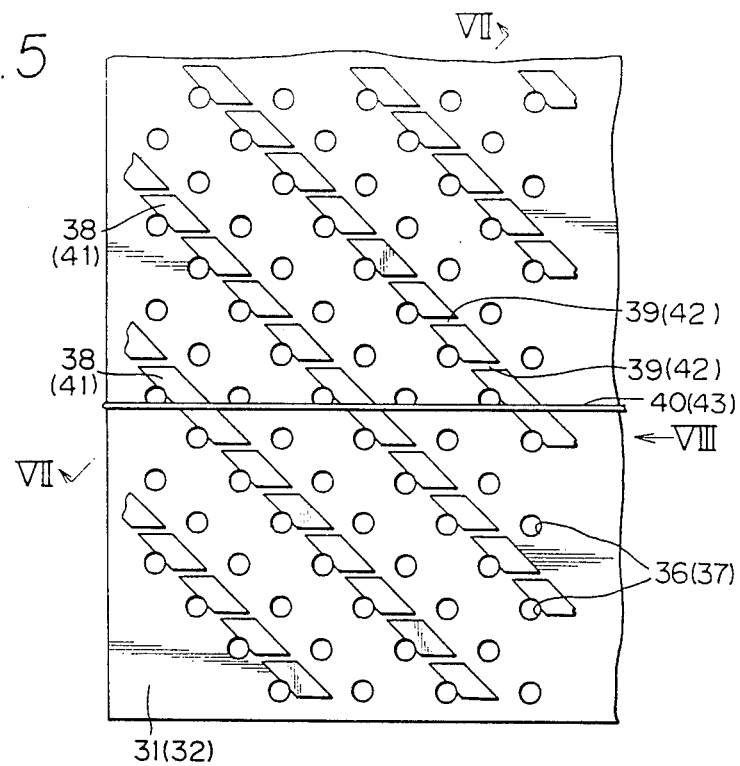
FIG. 5 is a partial plan view illustrating an inner section of the embodiment shown in FIG. 4.
Figure 6:
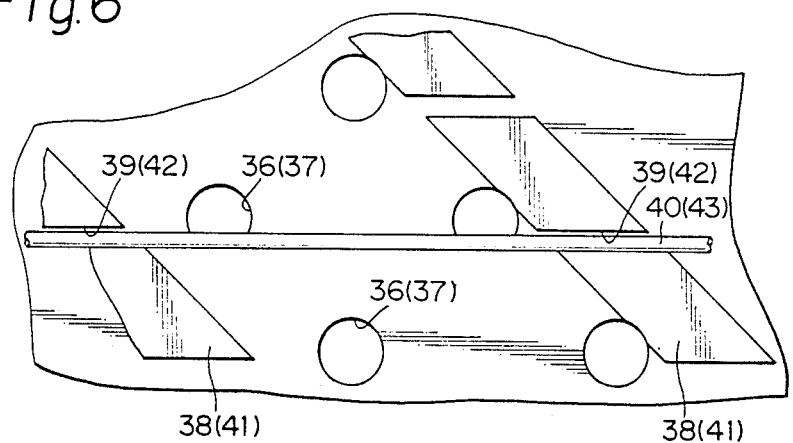
FIG. 6 is an enlarged view illustrating a part of FIG. 5.
Figure 7:
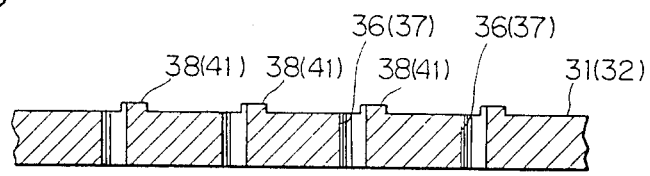
FIG. 7 is a cross-sectional view taken along the line VII—VII in FIG. 5.
Figure 8:
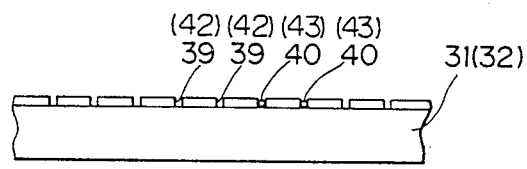
FIG. 8 is a cross-sectional view seen from an arrow VIII in FIG. 5.

As seen in FIGS. 5, 6, and 7, the X-coordinate plate 31 is provided on the top surface thereof with a plurality of parallel projections 38 extending at an angle of about 45° to the direction of the X-conductive patterns. These projections 38 are provided with guide grooves 39 along the X-coordinate lines. In each line of guide grooves 39, a single straight wire 40 is inserted and retained at positions between escape holes 36, as shown in FIG. 6, so that the wire 40 is allowed to resiliently bend and electrically contact the short plug 4, when the short plug 4 is inserted into the selected guide slot 35.

FIGS. 5, 6, 7 and 8 are used for illustration purposes, wherein reference numerals in parenthesis indicate Y-coordinate elements.

The Y-coordinate plate 32 is also provided on the top surface thereof with a plurality of parallel projections 41 extending at an angle of about 45° to the direction of the Y-conductive patterns. These projections 41 are provided with guide grooves 42 along the Y-coordinate lines. In each line of guide grooves 42, a single straight wire 43 is also inserted and retained at positions between escape holes 37, so that the wire 43 is allowed to resiliently bend and contact the short plug 4, when the short plug 4, is inserted into the selected guide slot 35. Thus, the selected X and Y-coordinate wires 40 and 43 are electrically connected to each other via the short plug 4.

Figure 4:
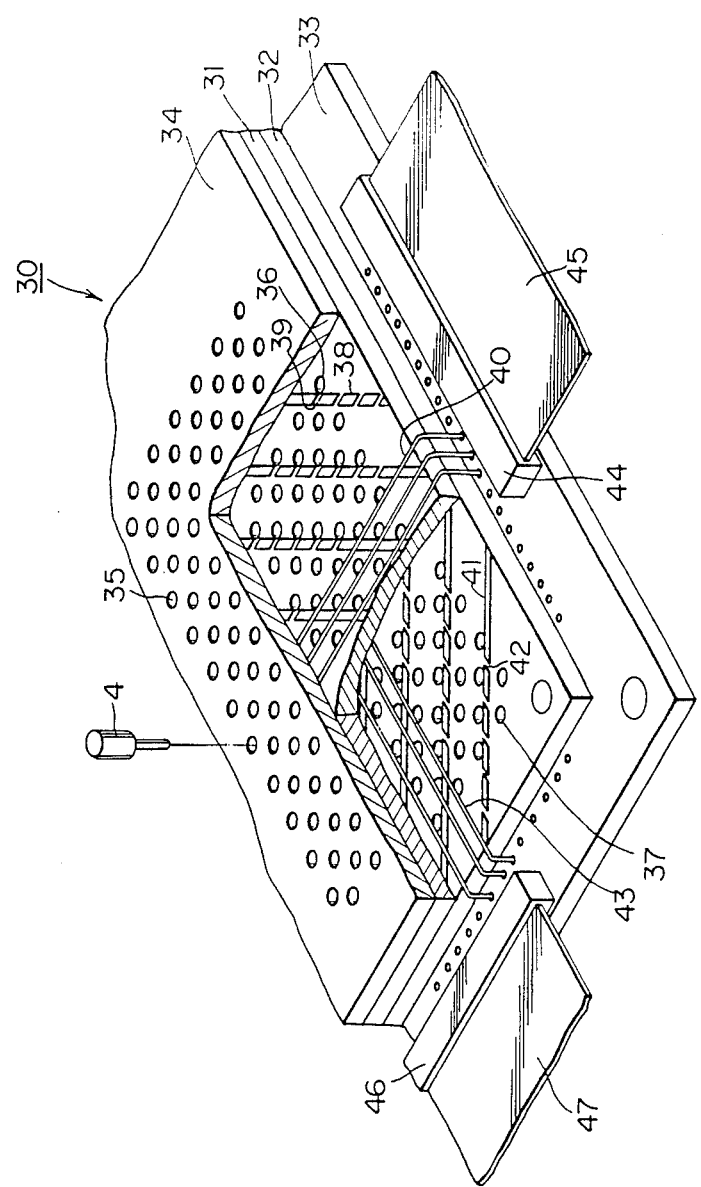
FIG. 4 is a partial, cross-sectional perspective view of a pin board matrix according another embodiment of the present invention.

In FIG. 4, the respective X-coordinate wires 40 extend to the terminals formed along one side edge of the board matrix 30, to which a connector 44 having a flat cable 45 is detachably connected. On the other hand, the respective Y-coordinate wires 43 extend to the terminals formed along another side edge, to which a connector 46 having a flat cable 47 is detachably connected.

Figure 9:
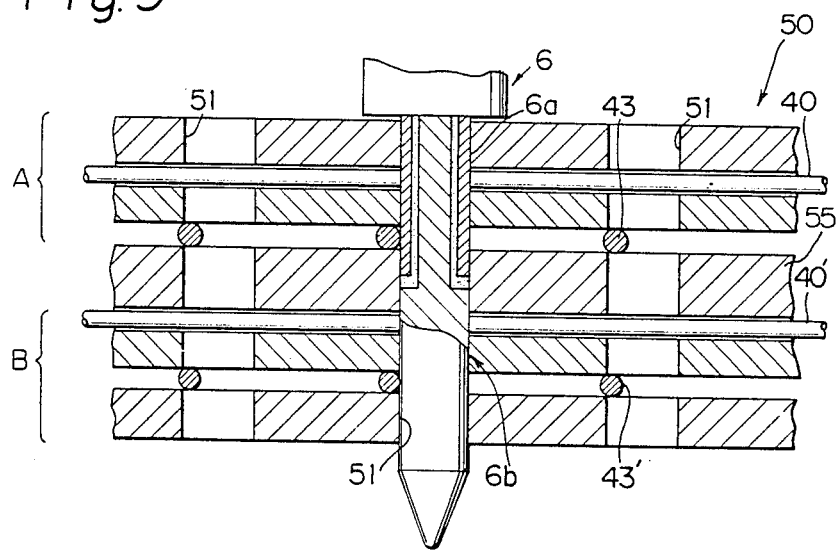
FIG. 9 is a cross-sectional view illustrating still another embodiment of this invention.

In another embodiment shown in FIG. 9, a matrix switch 50 includes two laminated boards A and B sandwiching by an intermediate plate 55. Each board is substantially the same as the board matrix 30 as shown in FIG. 4, and therefore, has X and Y-coordinate conductive patterns made of piano wires 40 and 43, and 40' and 43'. These laminated boards A and B have a plurality of common holes 51, each penetrating the two boards A and B, at positions corresponding to intersections of the respective X-coordinate patterns and Y-coordinate patterns. Therefore, when a dual-type short plug 6, having first and second conductive portions 6a and 6b, is inserted into a selected through hole 51, the X and Y-conductive wires 40 and 43 of the first board A, and the X and Y-conductive wires 40' and 43' of the second board B, corresponding to the selected through holes 51, are electrically connected to each other, respectively, via the first and second conductive portions 6a and 6b of the dual-type short plug 6, respectively.

This matrix switch 50 can be applied to a Main Distribution Frame (MDF), which is arranged between a plurality of pairs of transmitting lines, i.e. A lines and B lines, and between a plurality of pairs of terminals in a switching system.

Some of the pairs of transmitting lines (A lines) are connected to the respective X-conductive wires 40 and the others pairs (B lines) are connected to the respective X-conductive wires 40' corresponding to the X-conductive wires 40, respectively.

On the other hand, some of the pairs of terminals, which should be connected to A lines, are connected to the respective Y-conductive wires 43 and the other pairs, that should be connected to B lines, are connected to the respective Y-conductive wires 43' corresponding to the Y conductive wires 43, respectively.

Therefore, inserting one dual-type short plug into a selected through hole 51 is sufficient to connect a pair of transmitting lines to a certain pair of terminals in a switching system.

Figure 10:
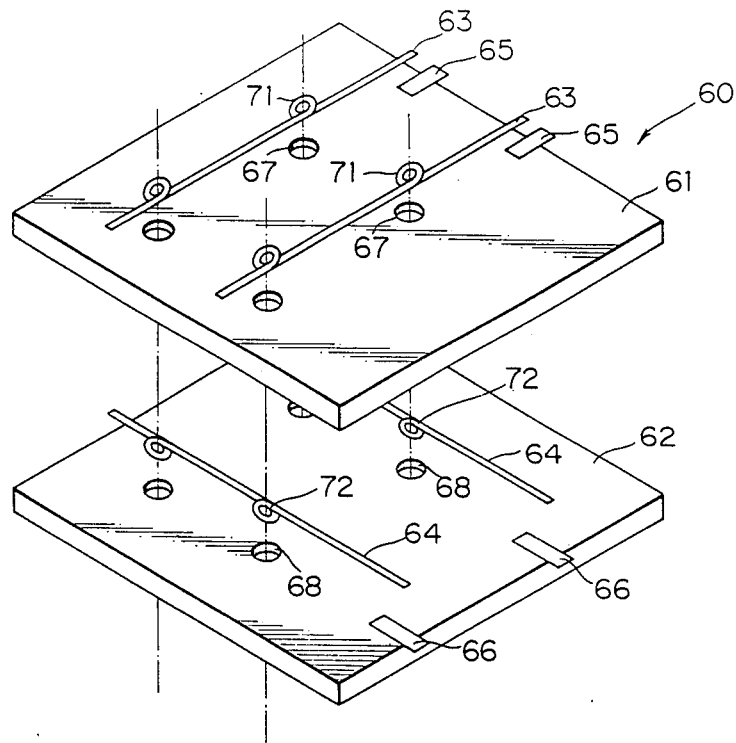
FIG. 10 is a schematic illustration of another embodiment of a pin board matrix according to the present invention.

FIG. 10 is schematic exploded illustration of still another embodiment of a pin board matrix 60 according to the present invention, which includes first and second insulative substrates 61 and 62, on which a plurality of conductive wires 63 and 64 are arranged in parallel, and connected at their one ends to a plurality of electric terminals 65 and 66, respectively. These first and second substrates 61 and 62 are integrally arranged and laminated so as to form a matrix pattern including the conductive wires 63 of the first substrate 61 and the conductive wires 64 of the second substrate 62. At the intersections of the matrix patterns, the first and second substrates 61 and 62 are provided with insert slots 67 and 68, respectively, and each of the conductive wires 63 and 64 is provided with ring-like deformed contact portions 71 and 72, respectively.

The ring-like deformed contact portions 71 and 72 of the conductive wires 63 and 64 have an appropriate resiliency in the radial direction, so that if a short plug 4 (FIG. 12) having a diameter slightly larger than the ring contact 71 and 72 is inserted into a selected slot, the selected contact portion 71 of the first board 61 and another contact portion 72 of the second board 62, namely the selected X-coordinate terminal 65 and Y-coordinate terminal 66, are electrically connected to each other via the short plug 4.

Figure 11:
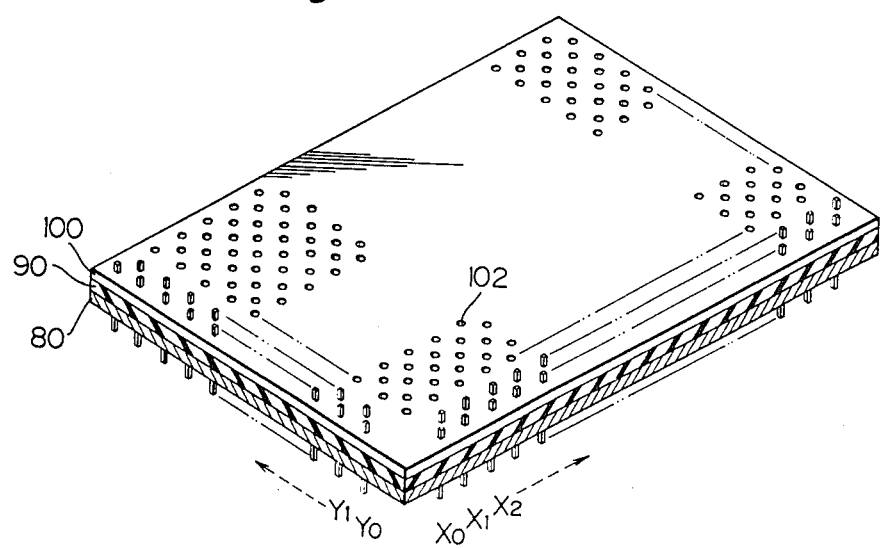
FIG. 11 is a perspective view illustrating the whole pin board matrix shown in FIG. 10.
Figure 12:
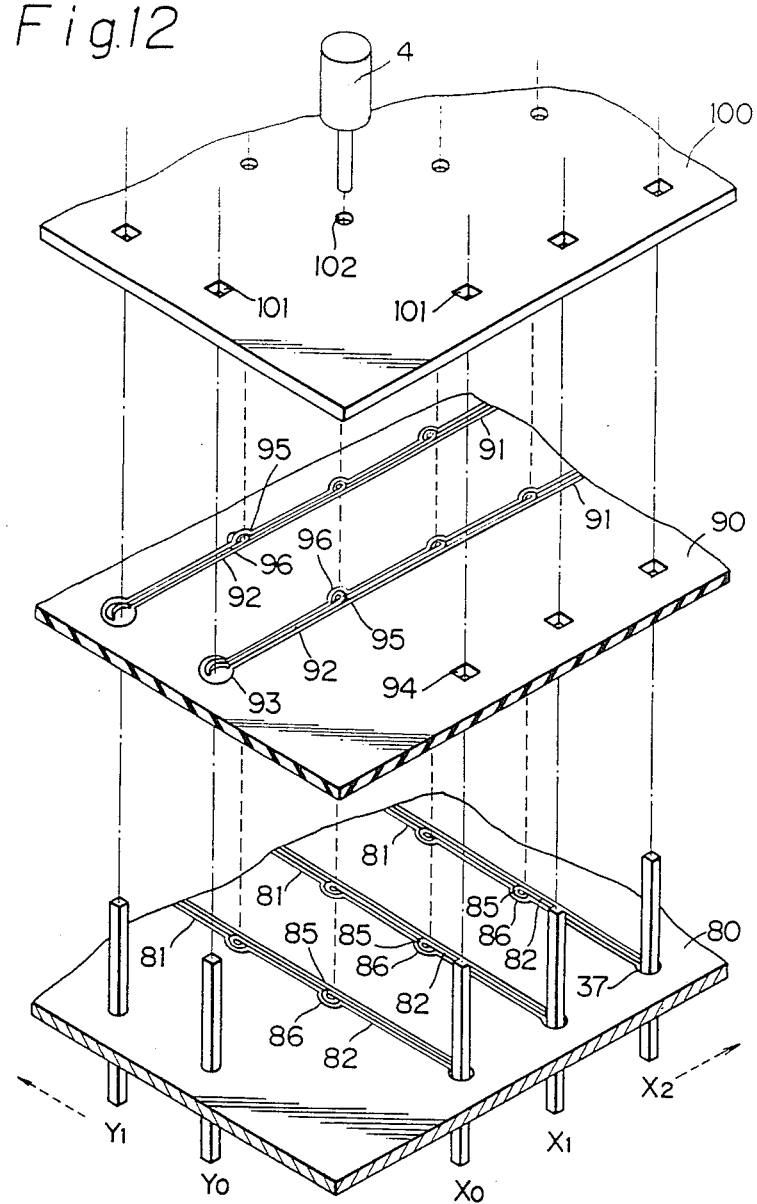
FIG. 12 is an exploded perspective view of the pin board matrix shown in the embodiment of FIG. 11.

FIG. 11 is a general perspective view of this embodiment, and FIG. 12 is an exploded perspective view thereof showing respective layers of the pin board matrix. A plurality of terminals $X_0, X_1, X_2, \ldots$ and $Y_0, Y_1, Y_2, \ldots$ are fixed on an insulative substrate 80 (FIG. 12). As illustrated, these terminals are projected from both the top and bottom surface of this laminated matrix board (FIG. 11). The terminals $X_0, X_1, X_2, \ldots$ are connected to one group of signal lines (not shown), and on the other hand, the terminals $Y_0, Y_1, Y_2, \ldots$ are connected to another group of signal lines (not shown). In addition, a plurality of parallel grooves 81 are formed on the top surface of the substrate 80 in the Y-direction so as to correspond to the terminals $X_0, X_1, X_2, \ldots$. The conductive wires 82 are arranged in these grooves 81 and each is connected at one end to a terminals $X_0, X_1, X_2$, respectively, . . . by soldering or the like.

An insulative substrate 90 is provided on its top surface with a plurality of parallel grooves 91 extending in the X-direction so as to correspond to the terminals $Y_0, Y_1, Y_2, \ldots$. The conductive wires 92 are also arranged in these grooves 91 and each is connected at one end by soldering or the like to the terminals $Y_0, Y_1, Y_2$, which penetrate through the slots 93. The terminals $X_0, X_1, X_2, \ldots$ penetrate through the slots 94.

A surface plate 100 is only an insulative substrate for covering the top of the substrate 90 and the conductive wires 92. The surface plate 100 has a number of slots 101, through which the terminals $X_0, X_1, X_2, \ldots$ and $Y_0, Y_1, Y_2, \ldots$ penetrate.

The conductive wires 82 forming the X-coordinate patterns and the conductive wires 92 forming the Y-coordinate patterns are provided, at the positions (indicated by broken lines in FIG. 12) of intersections with respect to each other, with ring-shaped contacts 85 and 95, respectively. Each of these contacts 85 and 95 is simply formed by bending or deforming the wire per se to a ring-shaped configuration, so that it has an appropriate resiliency in the radial direction.

The substrates 80 and 90 are provided with through holes 86 and 96, respectively, at these intersections, i.e., under the ring-shaped contacts 85 and 95 as mentioned above. Therefore, if the short plug 4, having a diameter a little larger than the inner diameter of the ring-shaped contact 85 (95), is inserted into a selected hole 102, both the ring-shaped contacts 85 and 95 of the conductive wires 82 and 92, respectively, come into resilient contact with the short plug 4, due to the resiliency of these contacts 85 and 95, and hereby electrical connection is established between the terminals $X_0$, and $Y_0$.

The conductive wires 82 and 92 may be advantageously made of, for example, gold plated piano wires or stainless wires, in the same manner as in the previous embodiment, and the inner diameter of the ring-shaped contact may be, for instance, about 1.4 mm. In this case, the diameter of the short plug 4 may be advantageously about 1.5 mm. The respective substrates 80 and 90 and the surface plate 100 are laminated as a single integral unit by using any suitable adhesion or screws in any known method.

Although certain preferred embodiments have been shown and described, it should be understood that many changes and modifications may be made therein without departing from the scope of the appended claims.

We claim:
1. A matrix switch, comprising:
   (a) a laminated board including at least one insulative substrate;
   (b) a plurality of parallel conductive patterns extending in an X-direction on a surface of the at least one substrate;
   (c) a plurality of parallel conductive patterns extending in a Y-direction substantially perpendicular to said X-direction on another surface of the at least one substrate;
   wherein each of said surfaces of said at least one substrate is provided with a plurality of parallel projections extending at an angle of 45° to the direction of the respective X- and Y-conductive patterns, said projections being provided with guide grooves extending in the X- and Y-directions to form a plurality of parallelograms; and
   (d) a short plug for making an electrical connection between said X-direction conductive patterns and said Y-direction conductive patterns,
   wherein said laminated board has a plurality of through holes which are aligned in the X- and Y-directions and also aligned on straight lines extending at an angle of 45° to the X- and Y-directions, each said through hole penetrating the sur- faces of said at least one substrate at positions corresponding to intersections of the respective X-conductive patterns and Y-conductive patterns so that, when said short plug is inserted into a selected through hole, the X- and Y-conductive patterns corresponding to said selected through hole are electrically connected to each other via said short plug, and wherein each said X- and Y-conductive pattern includes a single straight resilient metal wire and said straight wires are received in and retained by said guide grooves at positions between two adjacent said through holes, in such a manner that all of the through holes aligned in the X- and Y-directions are positioned at the same side of the straight wires, so that each wire is allowed to resiliently bend and come into contact with the short plug when inserted into said selected through hole.

2. A matrix switch, comprising:
(a) first and second laminated boards, each laminated board including at least one insulative substrate;
(b) a plurality of parallel conductive patterns extending in an X-direction on a surface of the at least one substrate;
(c) a plurality of parallel conductive patterns extending in a Y-direction substantially perpendicular to said X-direction on another surface of the at least one substrate;

wherein each of said surfaces of said at least one substrate is provided with a plurality of parallel projections extending at an angle of 45° to the direction of the respective X- and Y-conductive patterns, said projections being provided with guide grooves extending in the X- and Y-directions to form a plurality of parallelograms; and (d) a dual-type short plug having a first and a second conductive portion, wherein said laminated boards have a plurality of through holes which are aligned in the X- and Y-directions and also aligned on straight lines extending at an angle of 45° to and X- and Y-directions, each penetrating said laminated boards, at positions corresponding to intersections of the respective X-conductive patterns and Y-conductive patterns so that, when said dual-type short plug is inserted into a selected through hole, the X- and Y-conductive patterns of said first board and the X- and Y-conductive patterns of said second board, corresponding to said selected through hole, are electrically connected to each other, respectively, via said first and second conductive portions of the dual-type short plug, and wherein each said X- and Y-conducive pattern includes a single straight resilient metal wire and said straight wires are received in and retained by said guide grooves at positions between two adjacent said through holes, in such a manner that all of the through holes aligned in the X- and Y-directions are positioned at the same side of the straight wires, so that each wire is allowed to resiliently bend and come into contact with the short plug when inserted into said selected through hole

* * * * *

UNITED STATES PATENT AND TRADEMARK OFFICE
CERTIFICATE OF CORRECTION

PATENT NO. : 4,778,393

DATED : Oct. 18, 1988

INVENTOR(S) : Hosogai et al.

It is certified that error appears in the above-identified patent and that said Letters Patent is hereby corrected as shown below:

FRONT PAGE
[73] After "Japan" insert --and Nippon Telegraph and Telephone Corporation, Tokyo, Japan--.

[57] ABSTRACT
Line 10, delete "selected via" and insert --selected through hole are electrically connected to each other via--.

COL. 2
Line 1, delete "one is" and insert --one substrate is--.

COL. 5
Line 61, delete "terminals" and insert --terminal--.

COL. 6
Line 26, delete "hereby" and insert --thereby--.

COL. 8
Line 22, delete "Y-conducive" and insert --Y-conductive--.

Signed and Sealed this

Twenty-first Day of March, 1989

Attest:

DONALD J. QUIGG

*Attesting Officer*     *Commissioner of Patents and Trademarks*